(12) United States Patent
Yamamoto et al.

(10) Patent No.: US 9,246,502 B2
(45) Date of Patent: Jan. 26, 2016

(54) CONTROL METHOD OF D/A CONVERTER, D/A CONVERTER, CONTROL METHOD OF A/D CONVERTER, AND A/D CONVERTER

(71) Applicant: ASAHI KASEI MICRODEVICES CORPORATION, Tokyo (JP)

(72) Inventors: Ryuzo Yamamoto, Tokyo (JP); Junya Nakanishi, Tokyo (JP); Seiko Nakamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 14/437,237

(22) PCT Filed: Aug. 13, 2014

(86) PCT No.: PCT/JP2014/004185
§ 371 (c)(1),
(2) Date: Apr. 21, 2015

(87) PCT Pub. No.: WO2015/025504
PCT Pub. Date: Feb. 26, 2015

(65) Prior Publication Data
US 2015/0256191 A1     Sep. 10, 2015

(30) Foreign Application Priority Data

Aug. 21, 2013   (JP) .................................. 2013-171396

(51) Int. Cl.
*H03M 1/06* (2006.01)
*H03M 1/12* (2006.01)
(Continued)

(52) U.S. Cl.
CPC ............. *H03M 1/0614* (2013.01); *H03M 1/08* (2013.01); *H03M 1/0863* (2013.01); *H03M 1/12* (2013.01);
(Continued)

(58) Field of Classification Search
CPC ......... H03M 1/12; H03M 1/00; H03M 1/747; H04L 27/2647; H03F 1/3247; H04B 2001/7154
USPC .......... 341/120, 144, 118; 375/316, 346, 132, 375/296; 704/224
See application file for complete search history.

(56) References Cited

U.S. PATENT DOCUMENTS 4,600,915 A    7/1986  Yoshida
5,495,199 A    2/1996  Hirano
(Continued)

FOREIGN PATENT DOCUMENTS

JP    S57-141420 U    9/1982
JP    S60-145745 U    9/1985
(Continued)

*Primary Examiner* — Joseph Lauture
(74) *Attorney, Agent, or Firm* — Morgan, Lewis & Bockius LLP (57) ABSTRACT

The present invention relates to a control method of a D/A converter, a D/A converter, a control method of an A/D converter, and an A/D converter that can suppress an existing n-th harmonic without using a large-scale circuit, such as a bootstrap. A D/A converter (10) of the present invention is a D/A converter (10) that can suppress the generation of an existing n-th harmonic (n is an integer of 2 or more) of an analog output signal. The D/A converter (10) includes a D/A conversion unit (11) that converts an input digital signal into an analog signal and a control unit (12) that arbitrarily controls the timing of the sampling phase and the integral phase of the D/A conversion unit (11). The D/A conversion unit (11) is configured to generate an arbitrary n-th harmonic and superimpose the arbitrary n-th harmonic on an analog output signal including the existing n-th harmonic.

20 Claims, 11 Drawing Sheets

(51) Int. Cl.
  *H03M 1/66* (2006.01)
  *H03M 1/08* (2006.01)
  H03F 1/32 (2006.01)
  H03M 1/00 (2006.01)
  H03M 1/74 (2006.01)
  H04B 1/715 (2011.01)
  H04L 27/26 (2006.01)

(52) U.S. Cl.
  CPC ............... *H03M 1/66* (2013.01); *H03F 1/3247* (2013.01); *H03M 1/00* (2013.01); *H03M 1/747* (2013.01); *H04B 2001/7154* (2013.01); *H04L 27/2647* (2013.01)

(56) References Cited

U.S. PATENT DOCUMENTS 5,990,819 A    11/1999  Fujimori
6,323,697 B1   11/2001  Pavan
6,449,519 B1*   9/2002  Kuwaoka ............... G11B 20/10
                                              381/61
2007/0171118 A1  7/2007  Onishi
2010/0207801 A1  8/2010  Furuta et al.

FOREIGN PATENT DOCUMENTS

| | | |
|---|---|---|
| JP | S63-27114 A | 2/1988 |
| JP | S63-108236 U | 7/1988 |
| JP | H01-049311 A | 2/1989 |
| JP | H05-37300 A | 2/1993 |
| JP | H9-284096 A | 10/1997 |
| JP | H11-55121 A | 2/1999 |
| JP | 2002-043908 A | 2/2002 |
| JP | 2002-152021 A | 5/2002 |
| JP | 2002-204144 A | 7/2002 |
| JP | 2007-049232 A | 2/2007 |
| JP | 2010-193041 A | 9/2010 |

* cited by examiner

FIG. 15

CONTROL METHOD OF D/A CONVERTER, D/A CONVERTER, CONTROL METHOD OF A/D CONVERTER, AND A/D CONVERTER

TECHNICAL FIELD

The present invention relates to a control method of a D/A converter, a D/A converter, a control method of an A/D converter, and an A/D converter, and more specifically, to a control method of a D/A converter and a D/A converter to convert a digital input signal into an analog output signal and a control method of an A/D converter and an A/D converter to convert an analog input signal into a digital output signal.

BACKGROUND ART

In general, in a digital-to-analog converter (D/A converter) used in the audio field, a request relevant to distortion is strong, and a slight conversion error of an analog output signal causes the degradation of characteristics.

In this kind of digital-to-analog converter, a capacitive element is charged according to the signal level of the digital input signal, and an operational amplifier outputs an analog output signal according to the charging voltage of the capacitive element. In order to realize low distortion in the digital-to-analog converter having such a configuration, for example, PTL 1 discloses a digital-to-analog converter configured such that a connection point between an input terminal of a digital input signal and a capacitive element is connected to an output terminal of an operational amplifier at the time of connection between the capacitive element and the operational amplifier.

In a current situation where a low-distortion request for the D/A converter becomes increasingly stronger, as an example of the general technique for realizing low distortion of the D/A converter, a method of suppressing the distortion (n-th harmonic) generated due to non-linearity of the on-resistance value of a MOS switch by providing a bootstrap in a control unit of the MOS switch can be mentioned.

For example, PTL 2 relates to a low-distortion sample and hold circuit in an electronic circuit. PTL 2 discloses that a switch including a current path coupled between an input node $V_{IN}$ and an output node $V_{OUT}$ is included, and a capacitor is coupled to the output node $V_{OUT}$, and a current path coupled between the input node $V_{IN}$ and a supply voltage node $V_{DD}$ is included in a replicated device, for example, a bootstrap circuit including a bootstrap capacitor is coupled between a control terminal of a first switch and a control terminal of the replicated device.

CITATION LIST

Patent Literatures

PTL 1: Japanese Patent Application Laid-Open No. 11-55121 (Japanese Patent No. 3852721)
PTL 2: Japanese Patent Application Laid-Open No. 2002-43908

SUMMARY OF INVENTION

Technical Problem

However, in the above digital-to-analog converter disclosed in PTL 1, there is a problem that a transient characteristic changes with a change in the on-resistance value of a MOS transistor that forms a switch connecting the capacitive element and the output terminal and accordingly the distortion characteristic is degraded.

In addition, although PTL 2 discloses a technique of suppressing the existing n-th harmonic by reducing the non-linearity of the system, there is a problem that a large-scale circuit, such as a bootstrap, is required in order to suppress the existing n-th harmonic.

The present invention has been made in view of such problems, and it is an object of the present invention to provide a control method of a D/A converter, a D/A converter, a control method of an A/D converter, and an A/D converter that can suppress an existing n-th harmonic without using a large-scale circuit, such as a bootstrap.

Solution to Problem

According to an aspect of the present invention, the characteristics are as follows.

(1) A control method of a D/A converter capable of suppressing generation of an existing n-th harmonic (n is an integer of 2 or more) of an analog output signal includes: a step of generating an arbitrary n-th harmonic; and a step of superimposing the arbitrary n-th harmonic on an analog output signal including the existing n-th harmonic.

(2) In (1), the arbitrary n-th harmonic has an opposite phase to the existing n-th harmonic.

(3) In (1) or (2), the arbitrary n-th harmonic is generated by controlling switching noise appearing in the analog output signal.

(4) In (1) or (2), the arbitrary n-th harmonic is generated by controlling a change timing of the analog output signal.

(5) In (1) or (2), the arbitrary n-th harmonic is generated by controlling a rise time of the analog output signal.

(6) In (1) or (2), the arbitrary n-th harmonic is generated by controlling a timing of a control signal of a switch for starting an integral phase in a D/A conversion unit of the D/A converter.

(7) In (1) or (2), the arbitrary n-th harmonic is generated by controlling a rise time of a control signal of a switch for starting an integral phase in a D/A conversion unit of the D/A converter.

(8) In (1) or (2), a switch for starting an integral phase in a D/A conversion unit of the D/A converter is a CMOS switch, and controls a timing of a control signal of at least one of a PMOS and an NMOS.

(9) A D/A converter capable of suppressing generation of an existing n-th harmonic (n is an integer of 2 or more) of an analog output signal includes a D/A conversion unit that converts an input digital signal into an analog signal, and the D/A conversion unit generates an arbitrary n-th harmonic and superimposes the arbitrary n-th harmonic on an analog output signal including the existing n-th harmonic.

(10) In (9), the arbitrary n-th harmonic has an opposite phase to the existing n-th harmonic.

(11) In (9) or (10), the D/A conversion unit includes: an integral cap; a switch for starting an integral phase; an operational amplifier having an output terminal and an inverting input terminal that are connectable to each other through the integral cap in the integral phase; and a control unit that arbitrarily controls a timing of the integral phase of the D/A conversion unit.

(12) In (11), the control unit changes a timing of a control signal of the switch.

(13) In (11), the control unit changes a rise time of a control signal of the switch.

(14) In (11), the switch is a CMOS switch, and the control unit changes an on-timing of at least one of a PMOS and an NMOS.

(15) A D/A converter includes: a D/A conversion unit including an operational amplifier and a feedback switch, the feedback switch including a PMOS transistor and an NMOS transistor connected in parallel to the PMOS transistor and being provided in a feedback portion of the operational amplifier; and a control unit that changes an on-timing of at least one of the PMOS transistor and the NMOS transistor.

(16) In (15), the control unit arbitrarily shifts the on-timing of the PMOS transistor and the on-timing of the NMOS transistor.

(17) A control method of an A/D converter capable of suppressing generation of an existing n-th harmonic (n is an integer of 2 or more) of a digital output signal includes: a step of generating an arbitrary n-th harmonic; and a step of superimposing the arbitrary n-th harmonic on a digital output signal including the existing n-th harmonic.

(18) In (17), the arbitrary n-th harmonic has an opposite phase to the existing n-th harmonic.

(19) An A/D converter capable of suppressing generation of an existing n-th harmonic (n is an integer of 2 or more) of a digital output signal includes an A/D conversion unit that converts an input analog signal into a digital signal, and the A/D conversion unit generates an arbitrary n-th harmonic and superimposes the arbitrary n-th harmonic on a digital output signal including the existing n-th harmonic.

(20) In (19), the arbitrary n-th harmonic has an opposite phase to the existing n-th harmonic.

Advantageous Effects of Invention

According to the aspect of the present invention, the D/A conversion unit that converts an input digital signal into an analog signal is provided, and the D/A conversion unit generates an arbitrary n-th harmonic and superimposes the arbitrary n-th harmonic on the analog output signal including the existing n-th harmonic. Therefore, it is possible to realize a control method of a D/A converter and a D/A converter that can suppress the existing n-th harmonic without using a large-scale circuit, such as a bootstrap.

In addition, the A/D conversion unit that converts an input analog signal into a digital signal is provided, and the A/D conversion unit generates an arbitrary n-th harmonic and superimposes the arbitrary n-th harmonic on the digital output signal including the existing n-th harmonic. Therefore, it is possible to realize a control method of an A/D converter and an A/D converter that can suppress the existing n-th harmonic without using a large-scale circuit, such as a bootstrap.

DESCRIPTION OF EMBODIMENTS

In the following detailed description, a number of specific details to provide a thorough understanding of embodiments of the present invention are described. However, it will be apparent that one or more embodiments can be implemented even without such specific details. In addition, in order to simplify diagrams, well-known structures and devices are shown schematically.

Hereinafter, embodiments of the present invention will be described with reference to the diagrams.

Figure 1:
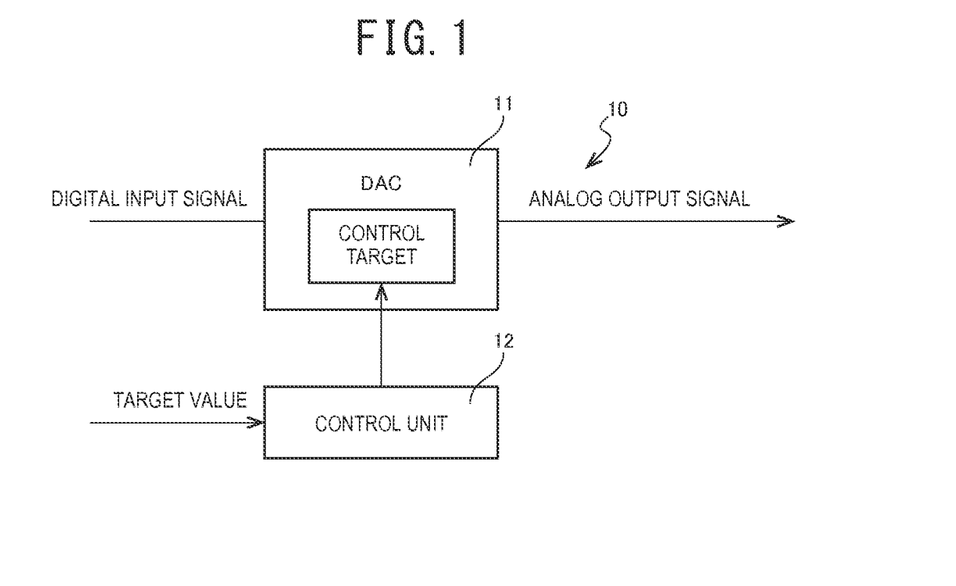
FIG. 1 is a block diagram for explaining an embodiment of a D/A converter according to the present invention.

FIG. 1 is a block diagram for explaining an embodiment of a D/A converter according to the present invention.

In the diagram, reference numeral 10 indicates a D/A converter, 11 indicates a D/A conversion unit (DAC), and 12 indicates a control unit.

The D/A converter 10 of the present embodiment is a D/A converter 10 that can suppress the generation of an existing n-th harmonic (n is an integer of 2 or more) of an analog output signal.

The D/A converter 10 includes the D/A conversion unit 11 that converts an input digital signal into an analog signal and the control unit 12 that arbitrarily controls the timing of the sampling phase and the integral phase of the D/A conversion unit 11. The D/A conversion unit 11 is configured to generate an arbitrary n-th harmonic and superimpose the arbitrary n-th harmonic on an analog output signal including the existing n-th harmonic.

That is, the D/A conversion unit 11 including a control target converts an input digital signal into an analog signal. In addition, the control unit 12 arbitrarily controls the timing of the sampling phase and the integral phase of the D/A conversion unit 11. The control unit 12 is configured to arbitrarily control the timing of the integral phase so that the analog output signal of the D/A conversion unit 11 becomes a target value or the difference between the analog output signal and the target value becomes small. Here, the target value is a value of the distortion characteristic of the D/A converter that is targeted, for example.

Instead of comparing the analog output signal with the target value using the control unit 12, it is possible to monitor the distortion characteristic of the analog output signal of the D/A converter 10 using an external measuring device and control the timing of the integral phase so that the distortion characteristic is improved. It is preferable that the control unit 12 is a clock generator.

An arbitrary n-th harmonic has an opposite phase to the existing n-th harmonic. The arbitrary n-th harmonic is generated by controlling switching noise. In addition, the arbitrary n-th harmonic is generated by controlling the change timing of the analog output signal. In addition, the arbitrary n-th harmonic is generated by controlling the rise time of the analog output signal.

Figure 2:
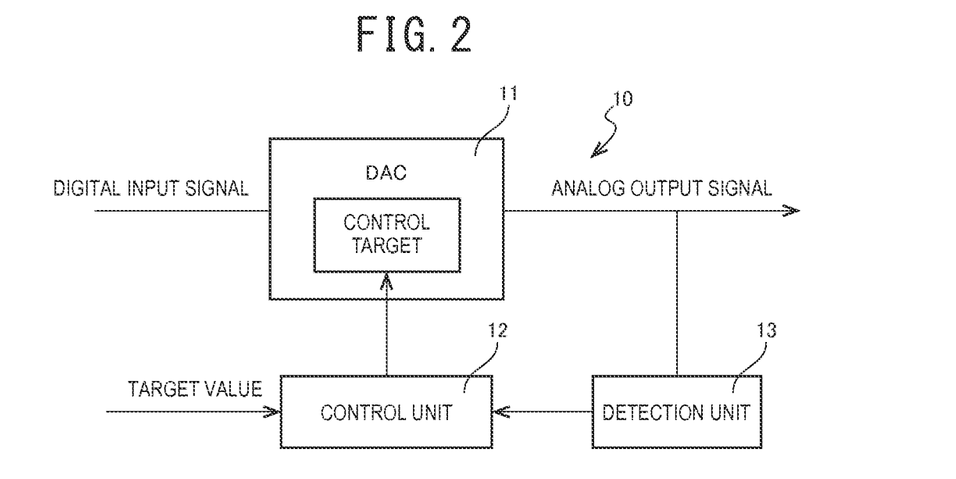
FIG. 2 is a block diagram for explaining another embodiment of the D/A converter according to the present invention.

FIG. 2 is a block diagram for explaining another embodiment of the D/A converter according to the present invention.

The D/A converter shown in FIG. 2 is different from the D/A converter shown in FIG. 1 in that a detection unit 13 is provided. Components having the same functions as in the D/A converter shown in FIG. 1 are denoted by the same reference numerals.

The detection unit 13 detects an analog signal of the D/A conversion unit 11. The control unit 12 is configured to arbitrarily control the timing of the integral phase so that the analog signal detected by this detection unit 13 becomes a target value.

Figure 3:
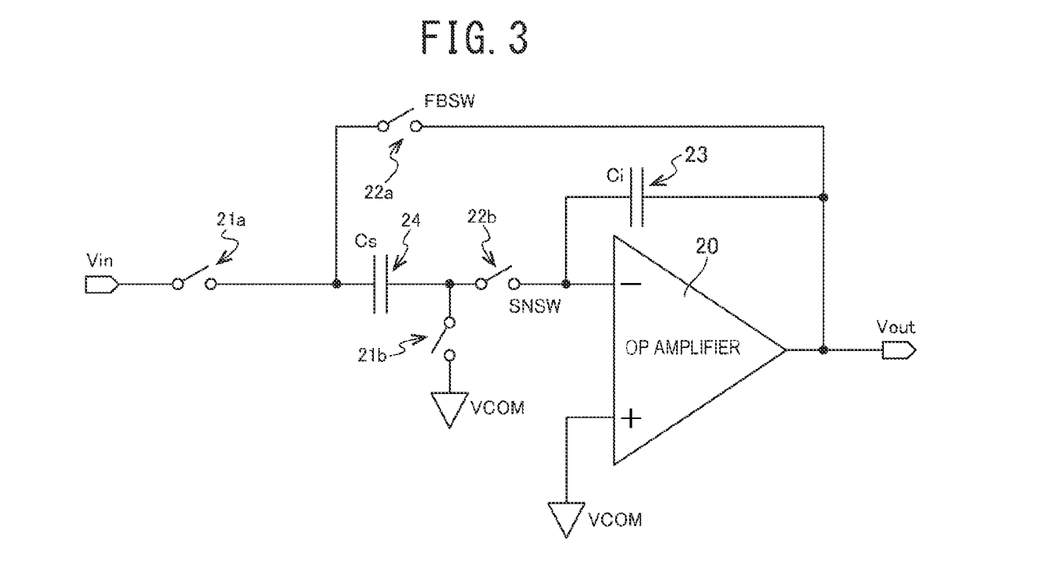
FIG. 3 is a circuit diagram for explaining a D/A conversion unit of the D/A converter shown in FIG. 1.

FIG. 3 is a circuit diagram for explaining the D/A conversion unit of the D/A converter shown in FIG. 1.

In the diagram, reference numeral 20 indicates an operational amplifier (OP amplifier), 21a indicates a first sampling switch, 21b indicates a second sampling switch, 22a indicates a feedback switch (FBSW), 22b indicates a summing node switch (SNSW), 23 indicates an integral cap (Ci), and 24 indicates a sample cap (Cs).

The D/A conversion unit 11 of the present embodiment includes: the operational amplifier 20 having an output terminal and an inverting input terminal connected to the integral cap 23 and a non-inverting input terminal connected to a reference voltage (VCOM); the first sampling switch 21a, the sample cap 24, and the summing node switch 22b that are connected to the inverting input terminal of the operational amplifier 20; the feedback switch 22a connected between the output terminal of the operational amplifier 20 and a connection point between the first sampling switch 21a and the sample cap 24; and the second sampling switch 21b connected between the sample cap 24 and the summing node switch 22b.

That is, the D/A conversion unit 11 includes the integral cap Ci (23), the feedback switch 22a for starting the integral phase, and the operational amplifier 20 having an output terminal and an inverting input terminal that can be connected to the integral cap Ci (23).

The control unit 12 controls the timing of a control signal input to each of the first sampling switch 21a, the second sampling switch 21b, the feedback switch 22a, and the summing node switch 22b of the D/A conversion unit 11.

The control unit 12 changes the timing of the control signal of the feedback switch 22a of the D/A conversion unit 11. In addition, the control unit 12 changes the rise time of the control signal of the feedback switch 22a.

The feedback switch 22a may be a PMOS or NMOS switch, and the control unit 12 changes the on-timing of the PMOS or NMOS switch by changing the timing of the control signal or changing the rise time of the control signal.

In addition, the feedback switch 22a may be a CMOS switch, and the control unit 12 changes the on-timing of at least one of the PMOS and the NMOS of the CMOS switch by changing the timing of the control signal or changing the rise time of the control signal.

The D/A converter 10 of the present embodiment includes: the D/A conversion unit 11 including the operational amplifier 20 and the feedback switch 22a that includes a PMOS transistor and an NMOS transistor connected in parallel to the PMOS transistor and that is provided in a feedback portion of the operational amplifier 20; and the control unit 12 that changes the on-timing of at least one of the PMOS transistor and the NMOS transistor.

The control unit 12 performs control so as to arbitrarily shift the on-timing of the PMOS transistor and the on-timing of the NMOS transistor.

Figure 4:
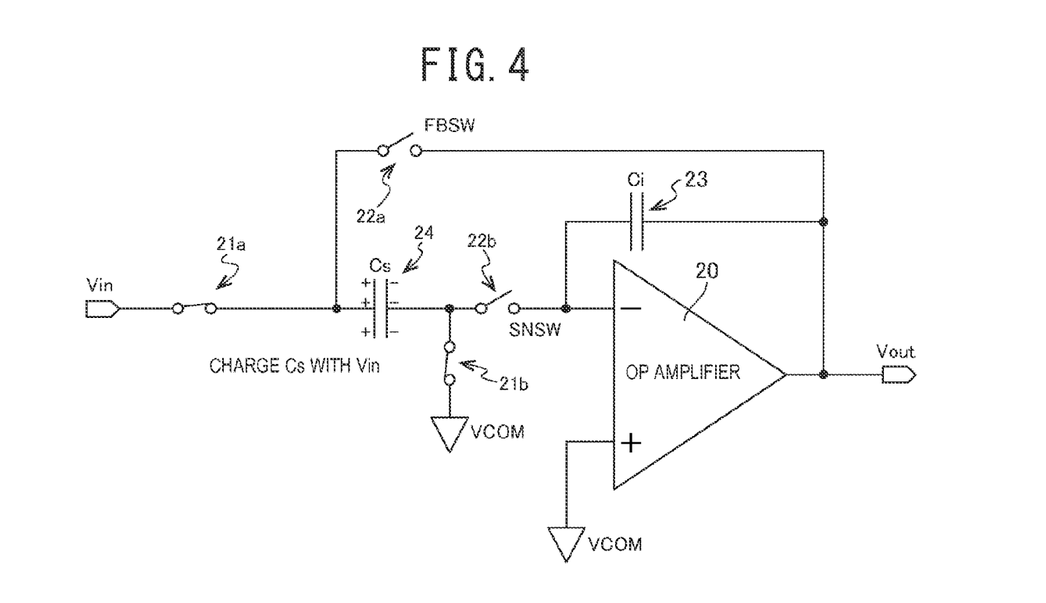
FIG. 4 is a circuit diagram for explaining the sampling phase of the D/A conversion unit shown in FIG. 3.

FIG. 4 is a circuit diagram for explaining the sampling phase of the D/A conversion unit 11 shown in FIG. 3.

In FIG. 4, in the sampling phase, the first sampling switch 21a and the second sampling switch 21b are ON, and the feedback switch (FBSW) 22a and the summing node switch (SNSW) 22b are OFF. In such a state, the sample cap (Cs) 24 is charged with an input voltage Vin. Here, the input voltage Vin is a reference voltage VDD or VSS or an intermediate voltage therebetween, and is a voltage determined according to the digital input signal.

Figure 5:
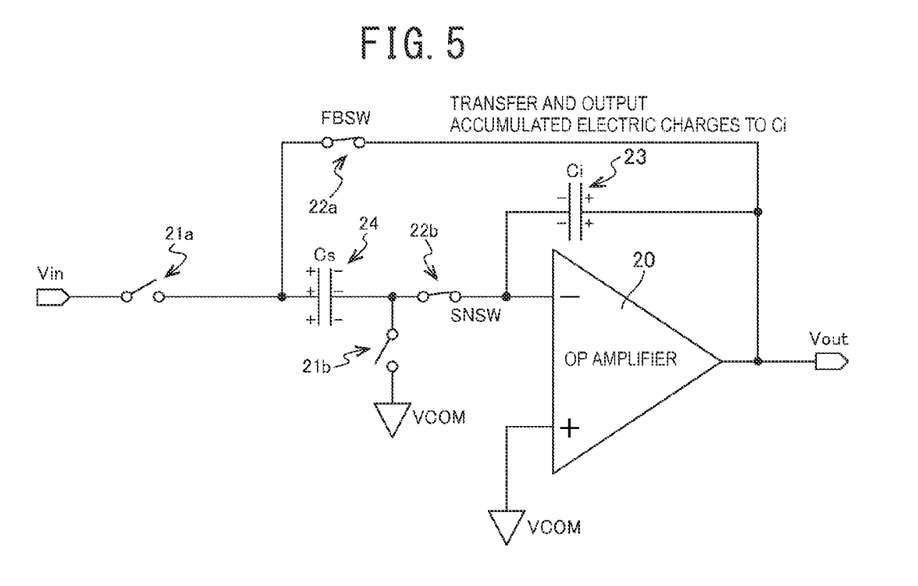
FIG. 5 is a circuit diagram for explaining the integral phase of the D/A conversion unit shown in FIG. 3.

FIG. 5 is a circuit diagram for explaining the integral phase of the D/A conversion unit 11 shown in FIG. 3.

In FIG. 5, in the integral phase, the first sampling switch 21a and the second sampling switch 21b are OFF, and the feedback switch (FBSW) 22a and the summing node switch (SNSW) 22b are ON. Electric charges accumulated in the sample cap (Cs) 24 in such a state are transmitted and output to the integral cap (Ci) 23.

Figure 6:
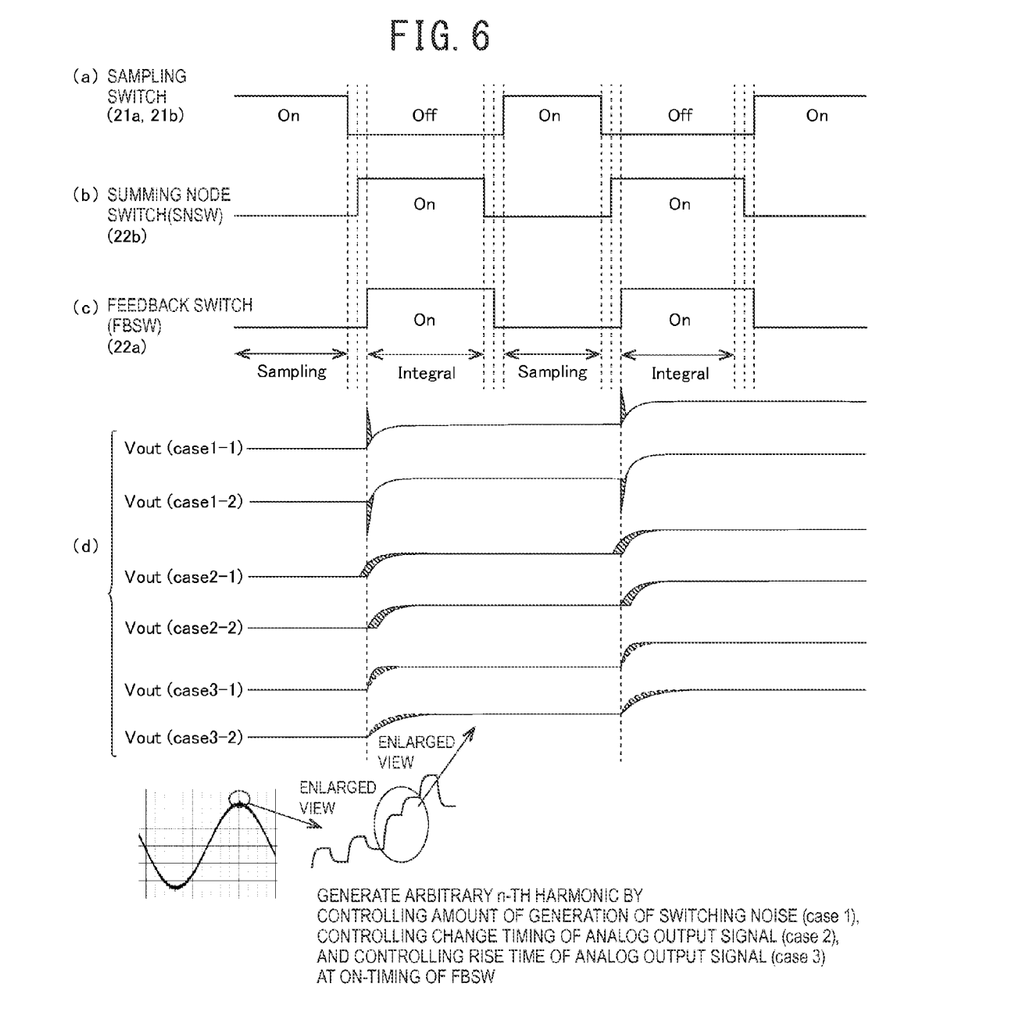
FIG. 6 is a diagram illustrating switch timing charts and output waveforms in the sampling phase and the integral phase shown in FIGS. 4 and 5.

FIG. 6 is a diagram illustrating switch timing charts and output waveforms in the sampling phase and the integral phase shown in FIGS. 4 and 5.

(a) of FIG. 6 is a diagram illustrating the switch timing chart of the first sampling switch 21a and the second sampling switch 21b shown in FIG. 4. (b) of FIG. 6 is a diagram illustrating the switch timing chart of the summing node switch 22b. (c) of FIG. 6 is a diagram illustrating the switch timing chart of the feedback switch 22a. (d) of FIG. 6 is a diagram illustrating an analog output signal Vout at the time of positive full-scale output.

In the sampling phase, the sampling switches 21a and 21b shown in (a) of FIG. 6 are turned on, and the summing node switch 22b and the feedback switch 22a shown in (b) of FIG. 6 is turned off (state shown in FIG. 4). In the integral phase, the sampling switches 21a and 21b shown in (a) of FIG. 6 are turned off, and the summing node switch 22b and the feedback switch 22a shown in (b) and (c) of FIG. 6 are turned on (state shown in FIG. 5).

The output waveform of the analog output signal Vout changes at a timing which is the start timing of the integral phase and at which the feedback switch 22a in (c) of FIG. 6 is turned on. It is possible to superimpose an arbitrary n-th harmonic on the analog output signal including the existing n-th harmonic by controlling the on-timing.

The on-timing can be controlled by the control unit 12. Since the control signal from the control unit 12 does not need to be controlled depending on the operating point of the analog output signal, the control signal can be realized with a small circuit. The reason will be described below.

First, an n-th harmonic can be generated by generating a new waveform depending on the operating point of the analog output signal.

A new waveform can be generated by changing the on-timing of the feedback switch 22a, which is the start timing of the integral phase, depending on the operating point, for example.

Here, the feedback switch 22a is formed of, for example, a PMOS, an NMOS, or a CMOS, and the analog output signal is a drain voltage of the feedback switch 22a. As a result, since a timing exceeding the threshold voltage of the feedback switch 22*a* depends on the operating point even if the control signal of the feedback switch 22*a* does not depend on the operating point of the analog output signal, it is possible to generate the n-th harmonic.

In order to generate the arbitrary n-th harmonic, the timing of the control signal of the feedback switch 22*a* is controlled to change the shape of a hatched portion of Vout (case 1-1) in (d) of FIG. 6, a hatched portion of Vout (case 1-2) in (d) of FIG. 6, a hatched portion of Vout (case 2-1) in (d) of FIG. 6, or a hatched portion of Vout (case 2-2) in (d) of FIG. 6 in which the envelope waveform is the n-th harmonic.

Alternatively, the rise time of the control signal is controlled to change the shape of the hatched portion of Vout (case 1-1) in (d) of FIG. 6, the hatched portion of Vout (case 1-2) in (d) of FIG. 6, a hatched portion of Vout (case 3-1) in (d) of FIG. 6, or a hatched portion of Vout (case 3-2) in (d) of FIG. 6 in which the envelope waveform is the n-th harmonic.

Alternatively, when the feedback switch is a CMOS switch, the on-timing of at least one of the PMOS and the NMOS is controlled to change the shape of the hatched portion of Vout (case 1-1) in (d) of FIG. 6, the hatched portion of Vout (case 1-2) in (d) of FIG. 6, the hatched portion of Vout (case 2-1) in (d) of FIG. 6, the hatched portion of Vout (case 2-2) in (d) of FIG. 6, the hatched portion of Vout (case 3-1) in (d) of FIG. 6, or the hatched portion of Vout (case 3-2) in (d) of FIG. 6 in which the envelope waveform is the n-th harmonic.

Here, the hatched portion of Vout (case 1-1) in (d) of FIG. 6 or the hatched portion of Vout (case 1-2) in (d) of FIG. 6 shows how the amount of switching noise appearing in the analog output signal changes. The hatched portion of Vout (case 2-1) in (d) of FIG. 6 or the hatched portion of Vout (case 2-2) in (d) of FIG. 6 shows how the change timing of the analog output signal changes. The hatched portion of Vout (case 3-1) in (d) of FIG. 6 or the hatched portion of Vout (case 3-2) in (d) of FIG. 6 shows how the rise time of the analog output signal changes.

Thus, it is possible to generate the arbitrary n-th harmonic by controlling the timing of the control signal of the feedback switch or controlling the rise time of the control signal.

Next, a technique of generating the arbitrary n-th harmonic will be described.

When generating the n-th harmonic, assuming that the switch is formed of a PMOS, the shape of the hatched portion of Vout (case 1-1) in (d) of FIG. 6 in which the envelope waveform is the n-th harmonic is obtained.

In order to generate an envelope waveform having an opposite phase, the switch is formed of an NMOS to obtain the shape of the hatched portion of Vout (case 1-2) in (d) of FIG. 6 in which the envelope waveform is the n-th harmonic.

Alternatively, the shape of the hatched portion of Vout (case 2-1) in (d) of FIG. 6 in which the envelope waveform is the n-th harmonic is obtained by advancing the timing of the control signal of the feedback switch 22*a*.

The shape of the hatched portion of Vout (case 2-2) in (d) of FIG. 6 in which the envelope waveform is the n-th harmonic is obtained by delaying the timing of the control signal of the feedback switch 22*a*.

Alternatively, when the feedback switch is a CMOS switch, the shape of the hatched portion of Vout (case 2-1) in (d) of FIG. 6 in which the envelope waveform is the n-th harmonic is obtained by making the change timing of the control signal of the PMOS switch earlier than the change timing of the control signal of the NMOS switch.

When the feedback switch is a CMOS switch, the shape of the hatched portion of Vout (case 2-2) in (d) of FIG. 6 in which the envelope waveform is the n-th harmonic is obtained by making the change timing of the control signal of the PMOS switch later than the change timing of the control signal of the NMOS switch.

Alternatively, the shape of the hatched portion of Vout (case 3-1) in (d) of FIG. 6 in which the envelope waveform is the n-th harmonic is obtained by advancing the rise time of the switch (by making the slope of the rising steep).

The shape of the hatched portion of Vout (case 3-2) in (d) of FIG. 6 in which the envelope waveform is the n-th harmonic is obtained by delaying the rise time of the switch (by making the slope of the rising gentle).

Figure 7:
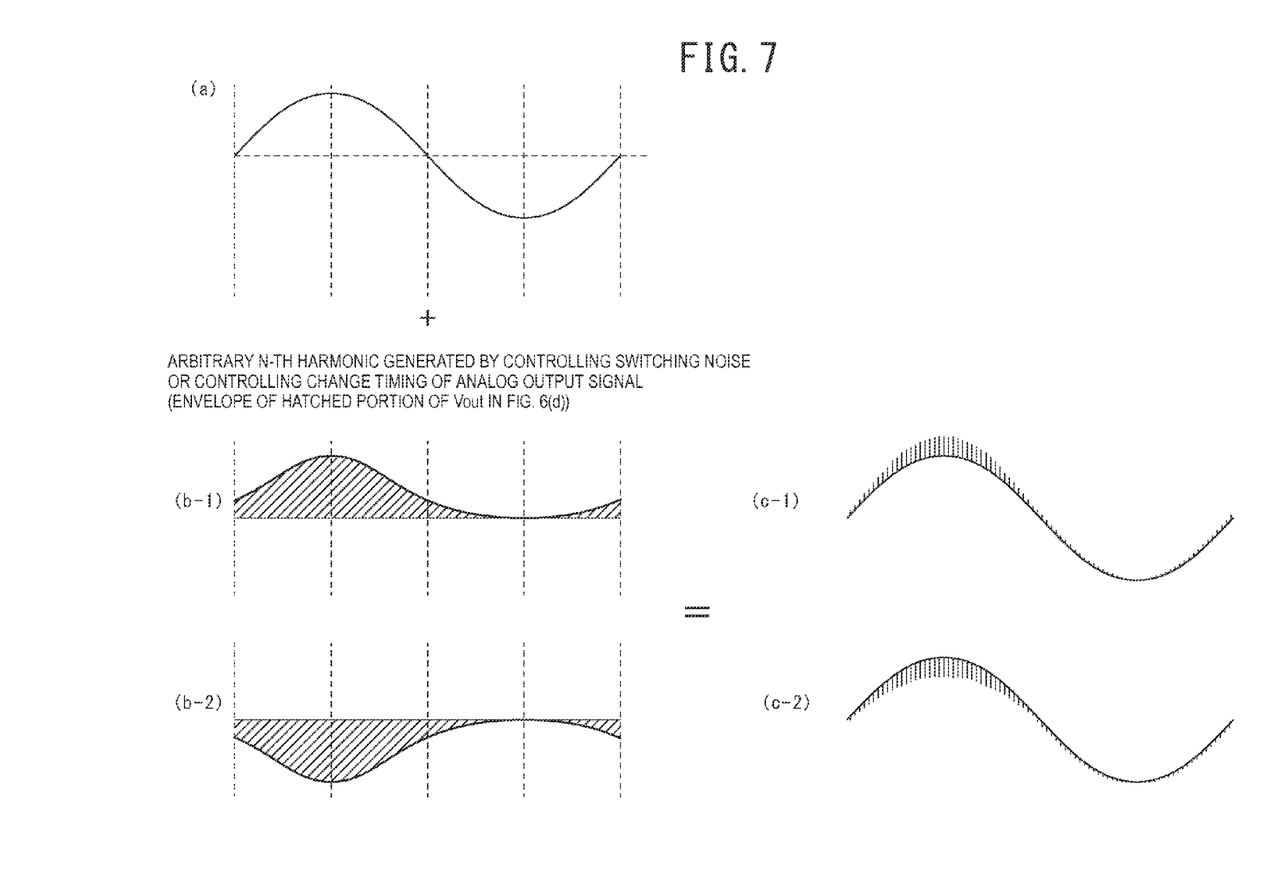
FIG. 7 is a diagram illustrating the relationship between the output waveform of the analog output signal and the n-th harmonic.

FIG. 7 is a diagram illustrating the relationship between the output waveform of the analog output signal and the n-th harmonic.

(a) of FIG. 7 illustrates an analog output waveform including the existing n-th harmonic. (b-1) of FIG. 7 illustrates an envelope waveform based on the shape of the hatched portion of Vout (case 1-1) in (d) of FIG. 6, the hatched portion of Vout (case 2-1) in (d) of FIG. 6, or the hatched portion of Vout (case 3-1) in (d) of FIG. 6. (b-2) of FIG. 7 illustrates an envelope waveform based on the shape of the hatched portion of Vout (case 1-2) in (d) of FIG. 6, the hatched portion of Vout (case 2-2) in (d) of FIG. 6, or the hatched portion of Vout (case 3-2) in (d) of FIG. 6. (c-1) of FIG. 7 illustrates a waveform obtained by superimposing the waveforms shown in (a) and (b-1) of FIG. 7. (c-2) of FIG. 7 illustrates a waveform obtained by superimposing the waveforms shown in (a) and (b-2) of FIG. 7.

When the arbitrary n-th harmonic shown in (b-1) or (b-2) of FIG. 7 is generated and superimposed on the output waveform of the analog output signal including the existing n-th harmonic shown in (a) of FIG. 7, an analog output signal on which the arbitrary n-th harmonic is superimposed is obtained as shown in (c-1) or (c-2) of FIG. 7. Since the arbitrary n-th harmonic can be selected to have an opposite phase to the existing n-th harmonic, the arbitrary n-th harmonic and the existing n-th harmonic are canceled by each other. Therefore, it is possible to realize low distortion.

As described above, the present invention is a technique of realizing low distortion by newly superimposing the n-th harmonic having an opposite phase on the existing n-th harmonic so that they are canceled each other. The implementation method may be realized by just adding a small circuit.

Although the D/A converter of the embodiment mentioned above has a single end configuration, the D/A converter may have a full differential configuration.

Thus, according to the D/A converter of the present invention, the D/A conversion unit that converts an input digital signal into an analog signal is provided, and the D/A conversion unit generates an arbitrary n-th harmonic and superimposes the arbitrary n-th harmonic on the analog output signal including the existing n-th harmonic. Therefore, it is possible to realize a D/A converter that can suppress the existing n-th harmonic without using a large-scale circuit, such as a bootstrap.

Next, a control method of a D/A converter according to the present invention will be described.

The control method of the D/A converter according to the present invention is a control method of the D/A converter 10 that can suppress the generation of an existing n-th harmonic (n is an integer of 2 or more) of an analog output signal. The control method includes a step of generating an arbitrary n-th harmonic and a step of superimposing the arbitrary n-th harmonic on an analog output signal including an existing n-th harmonic.

The arbitrary n-th harmonic has an opposite phase to the existing n-th harmonic. The arbitrary n-th harmonic is generated by controlling switching noise. In addition, the arbitrary n-th harmonic is generated by controlling the change timing of the analog output signal. In addition, the arbitrary n-th harmonic is generated by controlling the rise time of the analog output signal.

In addition, the arbitrary n-th harmonic is generated by controlling the timing of the control signal of the switch 22a for starting the integral phase. In addition, the arbitrary n-th harmonic is generated by controlling the rise time of the control signal of the switch 22a. The switch 22a is a CMOS switch, and generates the arbitrary n-th harmonic by controlling the timing of the control signal of at least one of the PMOS and the NMOS.

Thus, according to the control method of the D/A converter of the present invention, a step of generating an arbitrary n-th harmonic and a step of superimposing the arbitrary n-th harmonic on the analog output signal including the existing n-th harmonic are included. Therefore, it is possible to realize a control method of a D/A converter that can suppress the existing n-th harmonic without using a large-scale circuit, such as a bootstrap.

Next, the D/A converter will be described based on a specific circuit.

Figure 8:
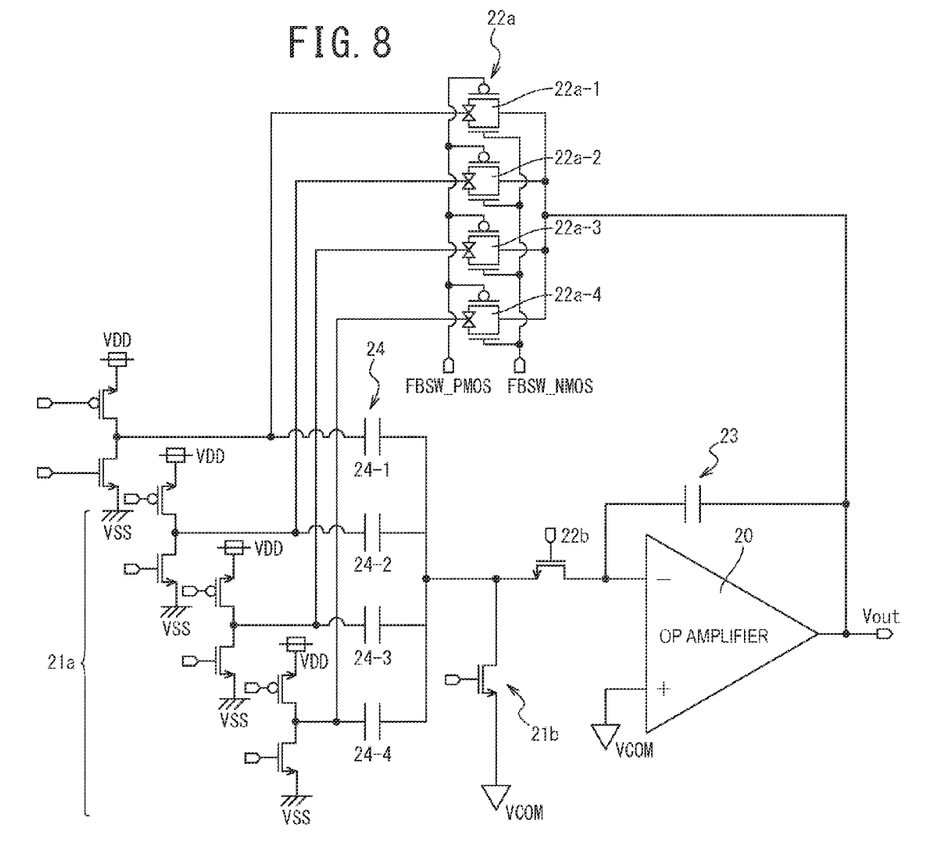
FIG. 8 is a circuit diagram for explaining the D/A conversion unit of the D/A converter shown in FIG. 1.

FIG. 8 is a circuit diagram for explaining the D/A conversion unit of the D/A converter shown in FIG. 1.

FIG. 8 shows a D/A conversion unit. In the D/A conversion unit shown in FIG. 3, the input signal charges one sample cap Cs (24) with electric charges of the input voltage Vin. However, in the D/A conversion unit shown in FIG. 8, the input signal charges a number of sample caps Cs (expressed by four sample caps 24-1 to 24-4 in FIG. 8) with the electric charges of the reference voltage VDD or VSS. Here, changing the number of sample caps connected to VDD or VSS means that the value of the input voltage Vin is changed (all of the sample caps are connected to VDD at the time of positive full-scale input signal, all of the sample caps are connected to VSS at the time of negative full-scale input signal, and half of the sample caps are connected to VDD and the remaining half are connected to VSS at the time of VCOM input signal). The feedback switch 22a (expressed by four feedback switches 22a-1 to 22a-4 in FIG. 8) is assumed to be a CMOS. Reference numerals 32 and 33 indicate both terminals of a variable resistor 30, and reference numerals 34-1 to 34-7 indicate inverters.

Figure 9:
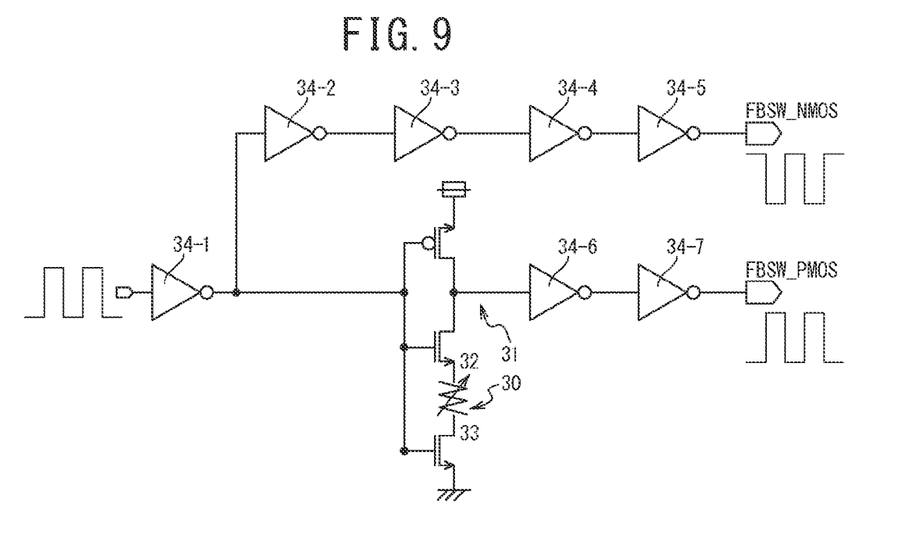
FIG. 9 is a circuit diagram for explaining a control circuit to control the on-timing of the control signal of a feedback switch of the D/A conversion unit shown in FIG. 8.

Next, FIG. 9 illustrates a circuit to control the on-timing of the control signal of the feedback switch.

FIG. 9 is a circuit diagram for explaining a control circuit to control the on-timing of the control signal of the feedback switch of the D/A conversion unit shown in FIG. 8.

The variable resistor 30 shown in FIG. 9 may have any configuration as long as the resistance value can be changed by the setting of a register or the like. The example is shown in FIG. 10.

Figure 10:
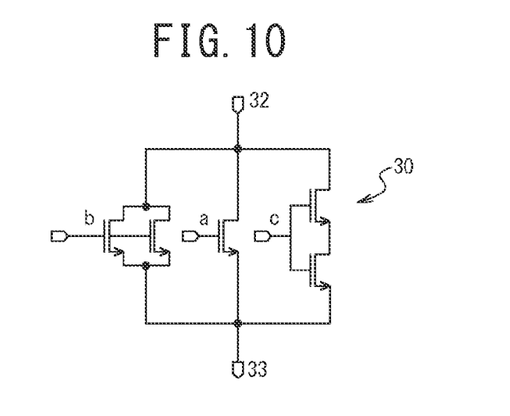
FIG. 10 is a circuit diagram for explaining a variable resistor of the control circuit shown in FIG. 9.

FIG. 10 is a circuit diagram for explaining the variable resistor of the control circuit shown in FIG. 9.

The variable resistor circuit shown in FIG. 10 can change the resistance value by performing control such that any one of MOS groups of circuits a, b, and c is turned on. In FIG. 10, at least two or more of the circuits a, b, and c may be provided.

By changing the resistance value of the variable resistor 30 in FIG. 9, the fall time at a node 31 is changed, and the time exceeding the threshold voltage of the next-stage inverter is changed. As a result, the on-timing of the PMOS of the feedback switch changes.

Figure 11:
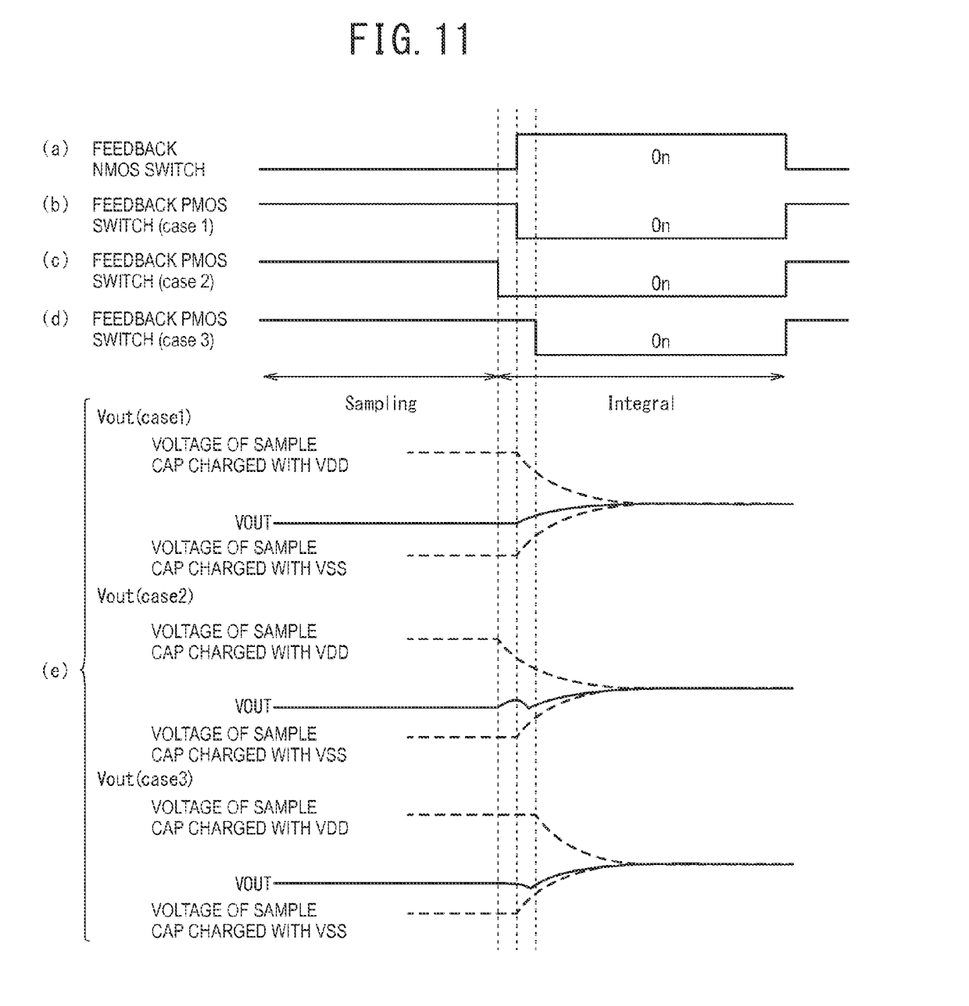
FIG. 11 is a diagram illustrating switch timing charts and output waveforms in the sampling phase and the integral phase.

FIG. 11 is a diagram illustrating switch timing charts and output waveforms in the sampling phase and the integral phase.

For example, using the circuit shown in FIG. 10 as the variable resistor 30 shown in FIG. 9, it is assumed that a feedback PMOS switch is turned on at the timing of case 1 in (b) of FIG. 11 when the MOS of a in FIG. 10 is turned on. When the MOS of b in FIG. 10 is turned on, the resistance value is smaller than that when the MOS of a is turned on. Accordingly, the feedback PMOS switch is turned on at the timing of case 2 in (c) of FIG. 11. When the MOS of c in FIG. 10 is turned on, the feedback PMOS switch is turned on at the timing of case 3 in (d) of FIG. 11.

As described above, in the D/A conversion unit shown in FIG. 8, charging using the electric charges of VDD or VSS is performed. However, at the on-timing of the PMOS of the feedback switch, the sample cap charged with VDD transmits and outputs the accumulated electric charges to the integral cap (Ci) 23.

On the other hand, at the on-timing of the NMOS of the feedback switch, the sample cap charged with VSS transmits and outputs the accumulated electric charges to the integral cap (Ci) 23.

Therefore, when the PMOS is turned on at the timing of case 1 in (b) of FIG. 11, the output signal has a waveform, such as Vout (case 1) in (e) of FIG. 11, by the charge transfer of the sample cap charged with VDD and the sample cap charged with VSS.

On the other hand, when the PMOS is turned on at the timing of case 2 in (c) of FIG. 11, the charge transfer of the sample cap charged with VDD starts earlier. Accordingly, the output signal has a waveform, such as Vout (case 2) in (e) of FIG. 11.

When the PMOS is turned on at the timing of case 3 in (d) of FIG. 11, the charge transfer of the sample cap charged with VSS starts earlier. Accordingly, the output signal has a waveform, such as Vout (case 3) in (e) of FIG. 11.

Next, a method of controlling the change timing of the output waveform will be described in detail.

The feedback switch is formed of a CMOS. The operating point of the output waveform is a source voltage of the feedback switch. That is, since the source voltage is close to VDD at the time of positive full-scale output, the timing at which the feedback switch is turned on is determined by the PMOS. Accordingly, if the control signal of OFF→ON of the PMOS of the CMOS switch is applied earlier than that of the NMOS, the control signal is turned on earlier than when the NMOS and the PMOS are simultaneously applied. On the contrary, when the control signal of OFF→ON of the PMOS is applied later, the control signal is turned on later than when the NMOS and the PMOS are simultaneously applied.

On the other hand, at the time of negative full-scale output, the timing at which the feedback switch is turned on is determined by the NMOS. There is no change in the on-timing.

That is, it is possible to generate the arbitrary n-th harmonic by controlling the on-timing of the PMOS of the CMOS in the feedback switch and accordingly to suppress the existing n-th harmonic. The phase of the n-th harmonic can be controlled by applying the control signal of OFF→ON of the PMOS earlier or later, and the absolute amount can be controlled by changing the amount of time by which the control signal of OFF→ON of the PMOS is applied earlier or later. As a circuit to realize this, for example, a delay circuit shown in FIG. 9 for generating the control signal of the feedback switch may be simply added.

In addition, although the circuit configuration is adopted in which the fall time at the node 31 is changed by changing the resistance value of the variable resistor 30 shown in FIG. 9, the present invention is not limited thereto. In FIG. 9, a circuit configuration may be adopted in which the rise time at the node 31 is changed by setting the variable resistor 30 on the PMOS side, and one inverter in the path of FBSW_PMOS may be reduced or increased.

Although the case has been described in which the on-timing of the PMOS of the feedback switch is changed, it is also possible to change the on-timing of the NMOS of the feedback switch.

In this case, in FIG. 9, the circuit configuration in which the fall time at the node 31 changes is replaced with an ordinary inverter, and a circuit in which the rise time changes and the variable resistor 30 is provided on the PMOS side is provided instead of one inverter in the path of FBSW_NMOS.

When the NMOS is turned on at a timing earlier than the timing at which the PMOS is turned on, the charge transfer of the sample cap charged with VSS starts earlier. In addition, when the NMOS is turned on at a timing later than the timing at which the PMOS is turned on, the charge transfer of the sample cap charged with VDD starts earlier. Accordingly, each output signal has a waveform described above.

In addition, this technique can also be applied to the A/D including a sample and hold circuit.

Figure 12:
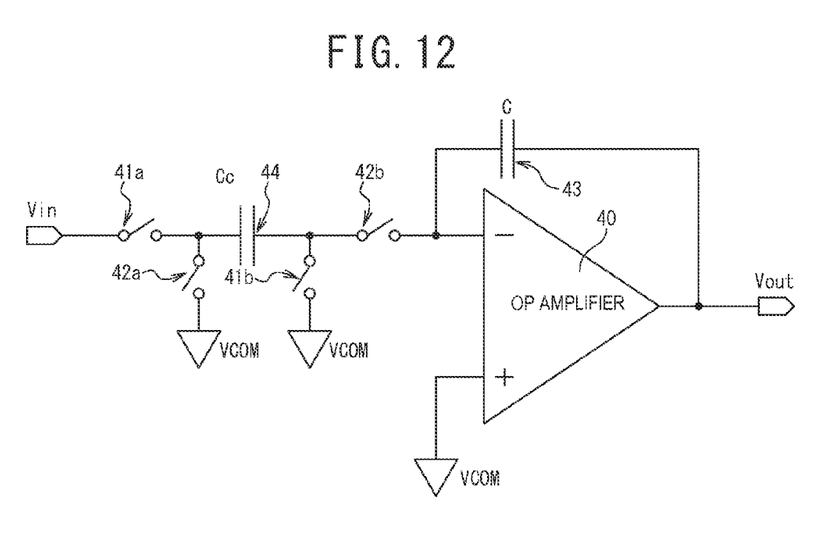
FIG. 12 is a circuit diagram for explaining an A/D conversion unit of an A/D converter.

FIG. 12 is a circuit diagram for explaining an A/D conversion unit.

In the diagram, reference numeral 40 indicates an operational amplifier (OP amplifier), 41a indicates a first sampling switch, 41b indicates a second sampling switch, 42a indicates a first integral switch, 42b indicates a second integral switch, 43 indicates an integral cap (C), and 44 indicates a sample cap (Cc).

Figure 13:
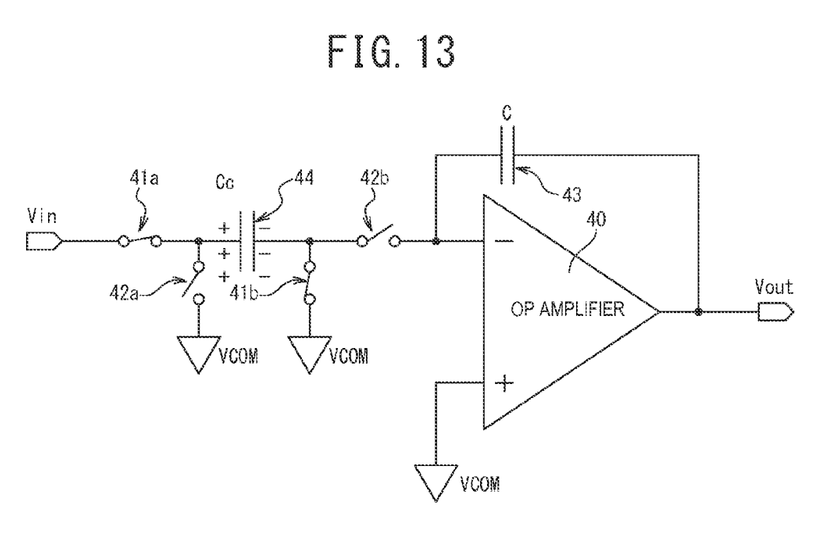
FIG. 13 is a circuit diagram for explaining the sampling phase of the A/D conversion unit shown in FIG. 12.

FIG. 13 is a circuit diagram for explaining the sampling phase of the A/D conversion unit shown in FIG. 12.

In FIG. 13, in the sampling phase, the first sampling switch 41a and the second sampling switch 41b are ON, and the first integral switch 42a and the second integral switch 42b are OFF. In such a state, the sample cap (Cc) 44 is charged with Vin.

A control method of an A/D converter according to the present invention can suppress the generation of the existing n-th harmonic (n is an integer of 2 or more) of a digital output signal, and includes a step of generating an arbitrary n-th harmonic and a step of superimposing the arbitrary n-th harmonic on the digital output signal including the existing n-th harmonic. The arbitrary n-th harmonic has an opposite phase to the existing n-th harmonic.

In addition, the A/D converter according to the present invention can suppress the generation of the existing n-th harmonic (n is an integer of 2 or more) of a digital output signal, and includes an A/D conversion unit that converts an input analog signal into a digital signal. The A/D conversion unit generates an arbitrary n-th harmonic and superimposes the arbitrary n-th harmonic on the digital output signal including the existing n-th harmonic. The arbitrary n-th harmonic has an opposite phase to the existing n-th harmonic.

Figure 14:
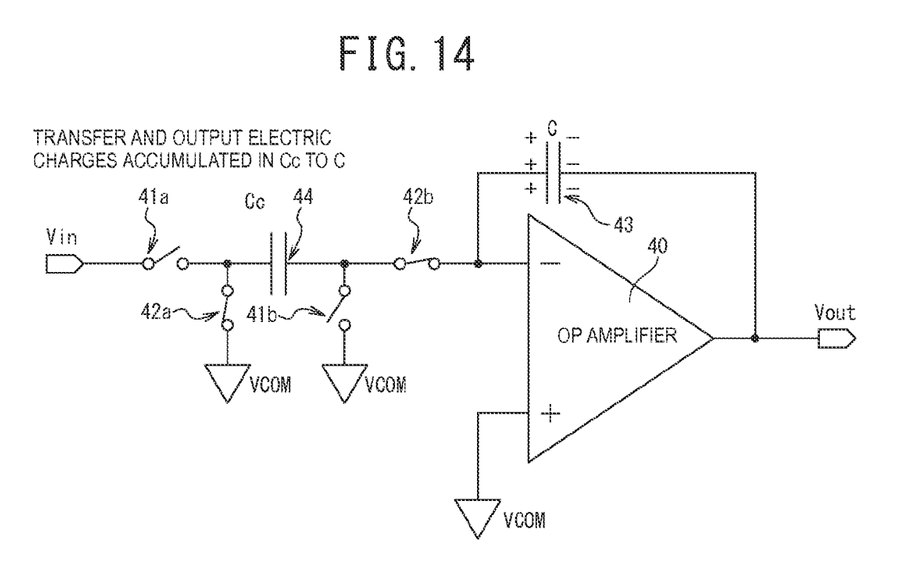
FIG. 14 is a circuit diagram for explaining the integral phase of the A/D conversion unit shown in FIG. 12.

FIG. 14 is a circuit diagram for explaining the integral phase of the A/D conversion unit shown in FIG. 12.

In FIG. 14, in the integral phase, the first sampling switch 41a and the second sampling switch 41b are OFF, and the first integral switch 42a and the second integral switch 42b are ON. Electric charges accumulated in the sample cap (Cc) 44 in such a state are transmitted and output to the integral cap (C) 43.

Figure 15:
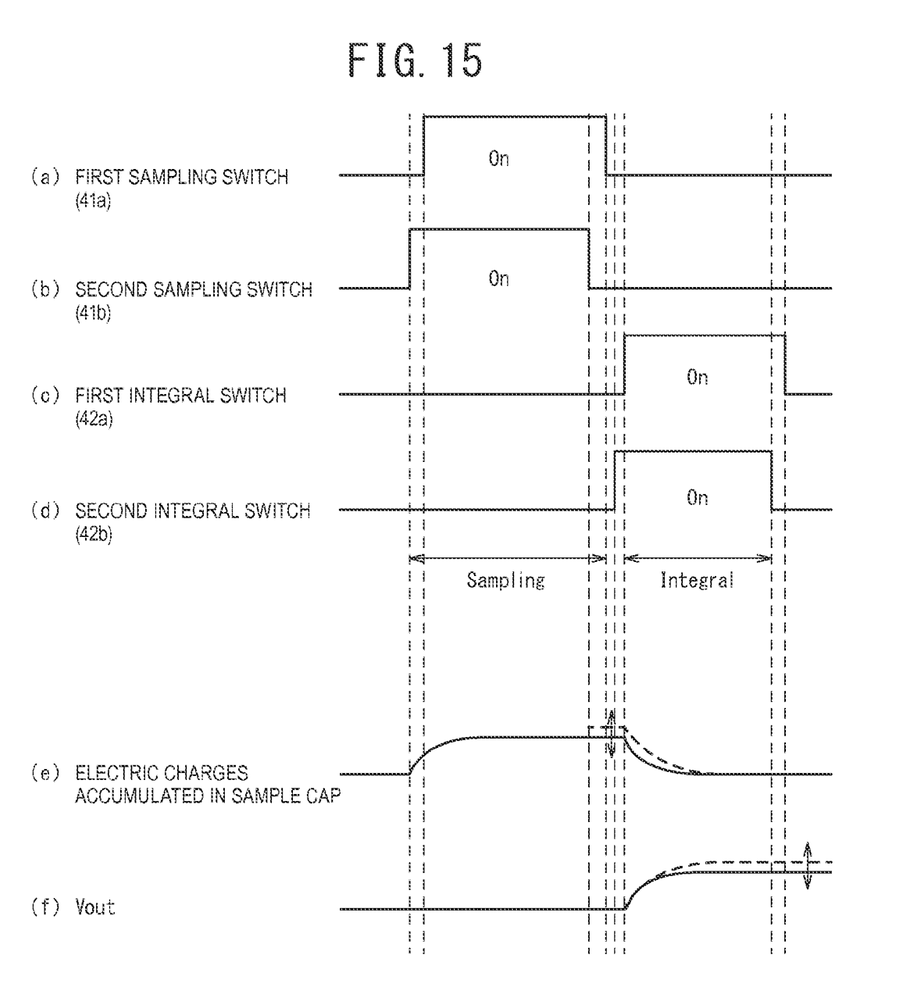
FIG. 15 is a diagram illustrating switch timing charts and an output waveform in the sampling phase and the integral phase shown in FIGS. 13 and 14.

FIG. 15 is a diagram illustrating switch timing charts, electric charges accumulated in the sample cap (Cc), and an output waveform in the sampling phase and the integral phase shown in FIGS. 13 and 14.

(a) of FIG. 15 is a diagram illustrating the switch timing chart of the first sampling switch 41a shown in FIG. 13. (b) of FIG. 15 is a diagram illustrating the switch timing chart of the second sampling switch 41b. (c) of FIG. 15 is a diagram illustrating the switch timing chart of the first integral switch 42a. (d) of FIG. 15 is a diagram illustrating the switch timing chart of the second integral switch 42b. (e) of FIG. 15 is a diagram illustrating the electric charges accumulated in the sample cap (Cc). (f) of FIG. 15 is a diagram showing an analog output signal.

In the sampling phase, the sampling switches shown in (a) and (b) of FIG. 15 are turned on, and the integral switches shown in (c) and (d) of FIG. 15 are turned off (state shown in FIG. 13). In the integral phase, the sampling switches shown in (a) and (b) of FIG. 15 are turned off, and the integral switches shown in (c) and (d) of FIG. 15 are turned on (state shown in FIG. 14).

The amount of electric charges transmitted to the integral cap is the amount of electric charges accumulated in the sample cap at the end timing of the sampling phase at which the first sampling switch 41a shown in (a) of FIG. 15 is turned off.

In addition, the amount of switching noise of 41b accumulated in the sample cap can be controlled by changing the time (transition time) at which the second sampling switch 41b is turned off. That is, it is possible to control the amount of electric charges transmitted to the integral cap.

A detailed mechanism is as follows.

At the end of the sampling phase, an SW connected to a VCM is turned off first and then a CMOSSW of an analog signal input unit is turned off.

If the charge injection amount of the SW connected to the VCM is constant, only offsetting is realized. However, since the CMOSSW is included in the impedance on the sample cap side, the impedance value changes at the operating point of the analog signal.

As a result, the amount of charge injection to the sample cap side changes depending on the analog signal, and this becomes a distortion component.

The charge injection amount is controlled by adjusting the OFF time (transition time) of the SW connected to the VCM.

The dotted line in (e) of FIG. 15 shows a state where the amount of switching noise of 41b accumulated in the sample cap is increased by changing the time (transition time) at which the second sampling switch 41b is turned off.

The dotted line in (f) of FIG. 15 shows a state where the amount of electric charges transmitted to the integral cap is increased and the output voltage Vout is changed as a result of the increase in the amount of switching noise.

As a result, it is possible to superimpose the arbitrary n-th harmonic on the analog signal including the existing n-th harmonic.

While the present invention has been described with reference to the specific embodiment, it is not intended to limit the invention by the description. By referring to the description of the present invention, other embodiments of the present invention and various modifications of the disclosed embodiment are apparent to those skilled in the art. Therefore, the appended claims should be understood including these embodiments or modifications included in the technical scope and spirit of the present invention.

REFERENCE SIGNS LIST

10: D/A converter
11: D/A conversion unit (DAC)

12: control unit
13: detection unit
20, 40: operational amplifier (OP amplifier)
21a, 41a: first sampling switch
21b, 41b: second sampling switch
22a, 22a-1 to 22a-4: feedback switch (FBSW)
22b: summing node switch (SNSW)
23: integral cap (Ci)
24, 24-1 to 24-4 sample cap (Cs)
30: variable resistor
31: node
32, 33: terminal
34-1 to 34-7: inverter
42a: first integral switch
42b: second integral switch
43: integral cap (C)
44: sample cap (Cc)

The invention claimed is:

1. A D/A converter, comprising:
a D/A conversion unit including an operational amplifier and a feedback switch, the feedback switch including a PMOS transistor and an NMOS transistor connected in parallel to the PMOS transistor and being provided in a feedback portion of the operational amplifier; and
a control unit changing an on-timing of at least one of the PMOS transistor and the NMOS transistor.

2. The D/A converter according to claim 1,
wherein the control unit arbitrarily shifts the on-timing of the PMOS transistor and the on-timing of the NMOS transistor.

3. A control method of a D/A converter capable of suppressing generation of an existing n-th harmonic (n is an integer of 2 or more) of an analog output signal, the control method comprising:
a step of generating an arbitrary n-th harmonic; and
a step of superimposing the arbitrary n-th harmonic on an analog output signal including the existing n-th harmonic.

4. The control method of a D/A converter according to claim 3,
wherein the arbitrary n-th harmonic has an opposite phase to the existing n-th harmonic.

5. The control method of a D/A converter according to claim 3,
wherein the arbitrary n-th harmonic is generated by controlling switching noise appearing in the analog output signal.

6. The control method of a D/A converter according to claim 3,
wherein the arbitrary n-th harmonic is generated by controlling a change timing of the analog output signal.

7. The control method of a D/A converter according to claim 3,
wherein the arbitrary n-th harmonic is generated by controlling a rise time of the analog output signal.

8. The control method of a D/A converter according to claim 3,
wherein the arbitrary n-th harmonic is generated by controlling a timing of a control signal of a switch for starting an integral phase in a D/A conversion unit of the D/A converter.

9. The control method of a D/A converter according to claim 3,
wherein the arbitrary n-th harmonic is generated by controlling a rise time of a control signal of a switch for starting an integral phase in a D/A conversion unit of the D/A converter.

10. The control method of a D/A converter according to claim 3,
wherein a switch for starting an integral phase in a D/A conversion unit of the D/A converter is a CMOS switch, and controls a timing of a control signal of at least one of a PMOS and an NMOS.

11. A D/A converter capable of suppressing generation of an existing n-th harmonic (n is an integer of 2 or more) of an analog output signal, comprising:
a D/A conversion unit converting an input digital signal into an analog signal,
wherein the D/A conversion unit generates an arbitrary n-th harmonic, and superimposes the arbitrary n-th harmonic on an analog output signal including the existing n-th harmonic.

12. The D/A converter according to claim 11,
wherein the arbitrary n-th harmonic has an opposite phase to the existing n-th harmonic.

13. The D/A converter according to claim 11,
wherein the D/A conversion unit includes:
an integral capacitor;
a switch for starting an integral phase;
an operational amplifier having an output terminal and an inverting input terminal that are connectable to each other through the integral capacitor in the integral phase; and
a control unit that arbitrarily controls a timing of the integral phase of the D/A conversion unit.

14. The D/A converter according to claim 13,
wherein the control unit changes a timing of a control signal of the switch.

15. The D/A converter according to claim 13,
wherein the control unit changes a rise time of a control signal of the switch.

16. The D/A converter according to claim 13,
wherein the switch is a CMOS switch, and
the control unit changes an on-timing of at least one of a PMOS and an NMOS.

17. A control method of an A/D converter capable of suppressing generation of an existing n-th harmonic (n is an integer of 2 or more) of a digital output signal, the control method comprising:
a step of generating an arbitrary n-th harmonic; and
a step of superimposing the arbitrary n-th harmonic on a digital output signal including the existing n-th harmonic.

18. The control method of an A/D converter according to claim 17,
wherein the arbitrary n-th harmonic has an opposite phase to the existing n-th harmonic.

19. An A/D converter capable of suppressing generation of an existing n-th harmonic (n is an integer of 2 or more) of the digital output signal, comprising:
an A/D conversion unit converting an input analog signal into a digital signal,
wherein the A/D conversion unit generates an arbitrary n-th harmonic, and superimposes the arbitrary n-th harmonic on a digital output signal including the existing n-th harmonic.

20. The A/D converter according to claim 19,
wherein the arbitrary n-th harmonic has an opposite phase to the existing n-th harmonic.

* * * * *